United States Patent [19]
Kuma

[11] Patent Number: 4,735,449
[45] Date of Patent: Apr. 5, 1988

[54] METHOD OF SUPPORTING AND/OR CONVEYING A PLATE WITH FLUID WITHOUT PHYSICAL CONTACT

[75] Inventor: Tosimi Kuma, Fukuoka, Japan

[73] Assignee: Kabushiki Kaisha Seibu Giken, Sasaguri, Japan

[21] Appl. No.: 855,375

[22] Filed: Apr. 24, 1986

[30] Foreign Application Priority Data

| May 4, 1985 | [JP] | Japan | 60-95743 |
| Jul. 15, 1985 | [JP] | Japan | 60-156817 |
| Jul. 26, 1985 | [JP] | Japan | 60-115402[U] |
| Aug. 9, 1985 | [JP] | Japan | 60-122865[U] |

[51] Int. Cl.$^4$ ............................................. B25J 15/06
[52] U.S. Cl. ................................................. 294/64.3
[58] Field of Search ............... 294/64.1, 64.3; 271/97, 271/98, 195; 406/88, 152, 153; 414/737, 744 B, 752

[56] References Cited

U.S. PATENT DOCUMENTS

| 3,005,652 | 10/1961 | Helm | 294/64.1 |
| 3,223,443 | 12/1965 | Misson | 294/64.3 X |
| 3,466,079 | 9/1969 | Mammel | 294/64.3 |
| 3,517,958 | 6/1970 | Boucher et al. | 294/64.3 X |
| 3,523,706 | 8/1970 | Logue | 294/64.3 |
| 3,796,455 | 3/1974 | Linkbom | 294/64.1 |

FOREIGN PATENT DOCUMENTS

| 1531192 | 7/1969 | Fed. Rep. of Germany . |
| 58-141536 | 8/1983 | Japan . |
| A2091698 | 8/1982 | United Kingdom . |
| 257628 | 11/1969 | U.S.S.R. ............................. 294/64.3 |

OTHER PUBLICATIONS

EP 86 30 3061 European Search Report.
IBM Technical Disclosure Bulletin, vol. 11, No. 2, Jul. 1968, "Wafer Pickup with Air Barrier" by Hayunga.
IBM Techinical Disclosure Bulletin, vol. 22, No. 8A, Jan. 1980, "Self-Centering Non-Contact Pick-Up" by Coles.
IBM Technical Disclosure Bulletin, vol. 23, No. 5, Oct. 1980, "Pickup Head for Apertured flat Members" by Haney et al.

Primary Examiner—Johnny D. Cherry
Attorney, Agent, or Firm—Staas & Halsey

[57] ABSTRACT

An improved method and apparatus are presented for supporting and/or conveying a plate by means of flow of fluid without physical contact. By providing a flat surface extending perpendicularly from the opening of a fluid delivery pipe and providing a suction pipe around the flat surface, static pressure of fluid becomes negative at the gap between the flat surface and a plate near the flat surface, to support and/or convey the plate beneath the flat surface without physical contact. The fluid delivered into the gap between the flat surface and plate is inhaled into the suction pipe and recirculated, to prevent the disturbance of the surrounding atmosphere by the fluid, the attachment of dust onto the plate and the introduction of dust into the fluid. This method is effective for handling of plates, such as semi-conductor wafers and magnetic discs, which should not be marred or stained by physical contact with a hand or a gripper.

13 Claims, 14 Drawing Sheets

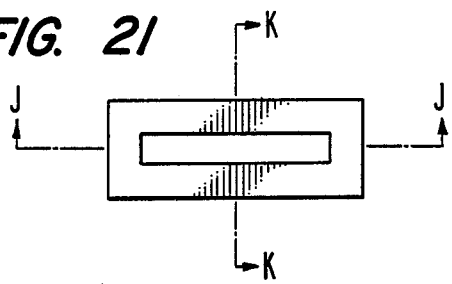
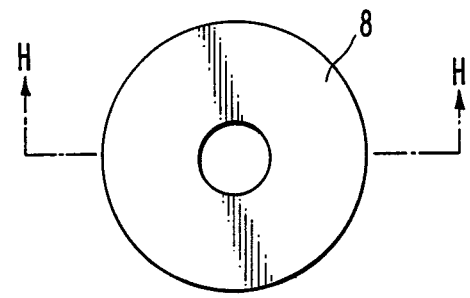
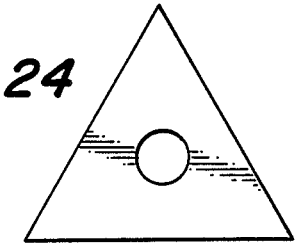
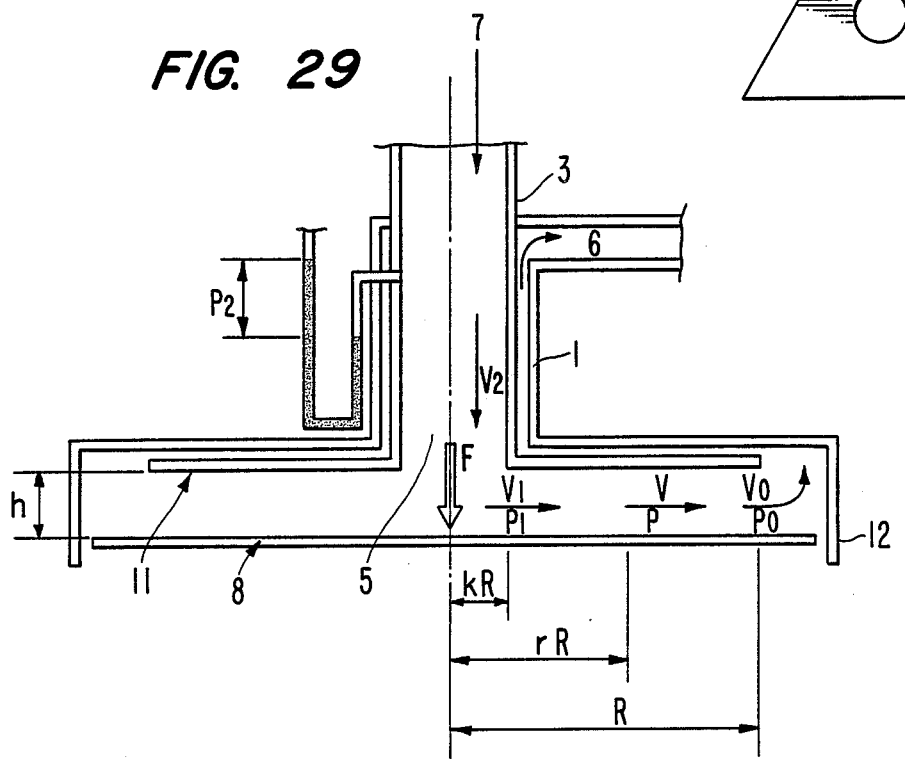

METHOD OF SUPPORTING AND/OR CONVEYING A PLATE WITH FLUID WITHOUT PHYSICAL CONTACT

BACKGROUND OF THE INVENTION

1. Field of the Invention

The present invention relates to a method of supporting and/or conveying a plate with fluid without physical contact. It is especially useful for supporting and/or conveying plates such as a silicone wafer or a floppy disc whose surface should be protected from minute scratches or contamination without physical contact with fluids such as air, and conveying them, if necessary, in the floating state.

2. Description of the Prior Art

The inventor of the present invention proposed in Japanese Pat. No. 40343/1976 a method of supporting a plate with fluid without physical contact, in which a suction pipe, and a delivery pipe which has an orifice near its delivery opening, are assembled as the openings of the suction pipe and of the delivery pipe face the same direction, and a fluid is inhaled in the suction pipe and at the same time a fluid is delivered from the orifice to support a plate near the openings without physical contact.

More particularly, as shown in FIGS. 1 and 2, a suction pipe 1p, and a delivery pipe 3p provided with an orifice 2p near the opening, are assembled such that openings 4p, 5p of both pipes located above plate 8 face the same direction, and a fluid 6 such as air is inhaled in the suction pipe 1 and at the same time a fluid 7 such as air is delivered from the orifice 2p as a jet flow, the negative pressure at the suction pipe 1p and the delivery pressure at the delivery pipe 3p being adjusted in proportion to the weight of the plate to be supported. Then, the plate 8 can be supported in the air without physical contact, keeping the distance between the openings 4p, 5p and the flat plate 8 constant and in the range of about 0.5 mm to several mm. The plate 8 can be conveyed horizontally, keeping the distance h, by applying a little force to the horizontal direction. In the drawing, 9p and 10p are ducts.

Where the vertical delivery opening 5p is extended to a substantially perpendicular direction (horizontal) to the flow of fluid in the delivery pipe 3p to form a flat surface 11p, and a plate 8 is brought under the opening 5p (FIG. 3), when the current speed of fluid 7 in the pipe 3p is constant, and when the distance of the gap h between the flat surface 11p and the upper face of plate 8 decreases, the current speed of fluid in the gap h increases, and the static pressure at the gap h decreases in accordance with Bernoulli's theorem. When this static pressure decreases to beneath atmospheric pressure and the product of this negative pressure and the area of the gap reaches to balance with the weight of plate 8, the plate 8 floats in the air without physical contact, with only a delivery pipe and without a suction pipe.

In the inventor's prior invention disclosed in Japanese Patent Application No. 71950/1985, the inventor has disclosed the test results of this theory, in which a plate was supported and/or conveyed with fluid without physical contact, by providing a flat surface 11p extending at opening 5p of a delivery pipe 3p to a substantially perpendicular direction to the flow direction of fluid 7 in the pipe 3p, moving the opening 5p near a plate 8, and delivering fluid 7 from delivery pipe 3p, as shown in FIGS. 3 and 4.

SUMMARY OF THE INVENTION

In the above-mentioned prior patent application, in the case of floating a plate in air, the air 7 delivered from the gap between the flat surface 11 and the plate 8 disturbs the surrounding atmosphere to raise dust in the room. The aforementioned plate, such as a silicone wafer or a floppy disc, has been handled in a clean room controlled to remove dust, but such a plate should be handled in the room with little disturbance of air and prevented from having dust attached thereto. Accordingly, the delivered fluid 7 should not be delivered from the edges of the flat surface 11p and of the plate 8 to the surrounding atmosphere.

The object of the present invention is to support and, when needed, to convey, a plate in the air (and other fluids) without physical contact, preventing the disturbance of the surrounding atmosphere by the fluid being delivered from the gap between the flat surface and the plate, while preventing dust from being attached to the plate.

This object can be achieved by providing suction opening(s) at the periphery of the flat surface in the prior application, and inhaling the delivered fluid into the suction opening (and suction pipe). The same effect can be obtained by providing a flat surface extending at the opening of an inhaling pipe in a substantially perpendicular direction to the flow direction of fluid in the inhaling pipe, and providing a torus delivery opening of a delivery pipe around the periphery of the flat surface, to prevent the delivery of fluid from the gap between the flat surface and the plate to the surrounding atmosphere.

The principle of the present invention is that the fluid 7 delivered from the delivery pipe 3 forms a jet stream, passes in a little gap h between the flat surface 11 and the plate 8, and is inhaled in the suction pipe 1 as shown in FIG. 5. The sectional area of the gap h is extremely small compared with the sectional area of the delivery pipe 3, and the flow speed of the fluid in the gap becomes extremely high when compared with the flow speed in the delivery pipe 3, and the static pressure in the gap h is lower than the atmospheric pressure, permitting the plate 8 to be supported in the fluid without physical contact.

If the plate 8 comes in contact with the flat surface 11, the flow speed of fluid in the delivery pipe 3 would become zero and the plate 8 would receive the delivery pressure in the pipe 3 and, therefore, the plate 8 cannot make contact with the flat surface 11.

BRIEF DESCRIPTION OF THE DRAWINGS

FIG. 19 is a plan view of an example of the plate handled in the FIG. 15 embodiment of the present invention;

FIG. 20 is a sectional view taken upon the line H—H of FIG. 19;

FIG. 21 is a plan view of another example of the plate handled in the FIG. 15 embodiment of the present invention;

FIG. 22 is a sectional view taken upon the line J—J of FIG. 21;

FIG. 23 is a sectional view taken upon the line K—K of FIG. 21;

FIG. 24 is a plan view of a third example of the plate handled in the FIG. 15 embodiment of the present invention;

FIG. 29 is a vertical view illustrating the action and the effect of the present invention.

DESCRIPTION OF THE PREFERRED EMBODIMENTS

Example 1

Figure 5:
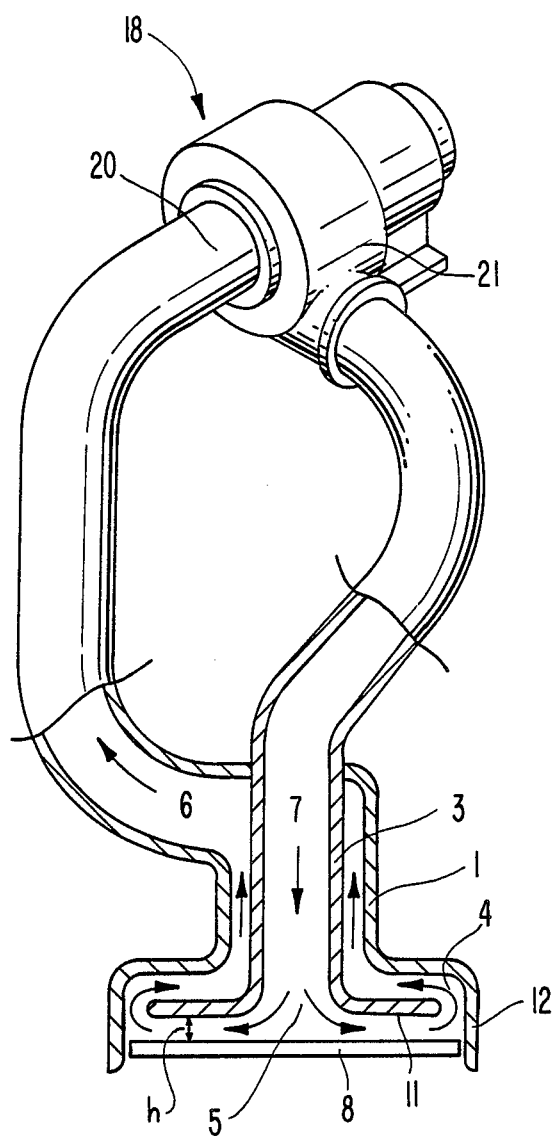
FIG. 5 is a vertical sectional view of the essential features of the present invention.

As shown in FIG. 5, opening 5 of a vertical delivery pipe 3, which is round in cross-section, is extended in a substantially perpendicular direction to form a flat surface 11. A torus suction pipe 1 is provided around the delivery pipe 3, the end of which is provided with an opening 4 around the flat surface 11. The lower periphery of the outer wall of the torus suction pipe 1 is extended several mm to 20 mm lower than the flat surface 11 to form a stopper 12. The delivery pipe 3 is connected to a delivery opening 21 of a fan 18, and the suction pipe 1 is connected to a suction opening 20 of the fan 18.

Openings 4 and 5 are near a plate 8, and air 7 is delivered from delivery pipe 3 and air 6 of the same volume as the air 7 is inhaled in suction pipe 1. The plate 8 floats in the air without contacting the openings 4, 5 and the flat surface 11, and can be conveyed with the entire apparatus by moving same.

Example 2

Figure 6:
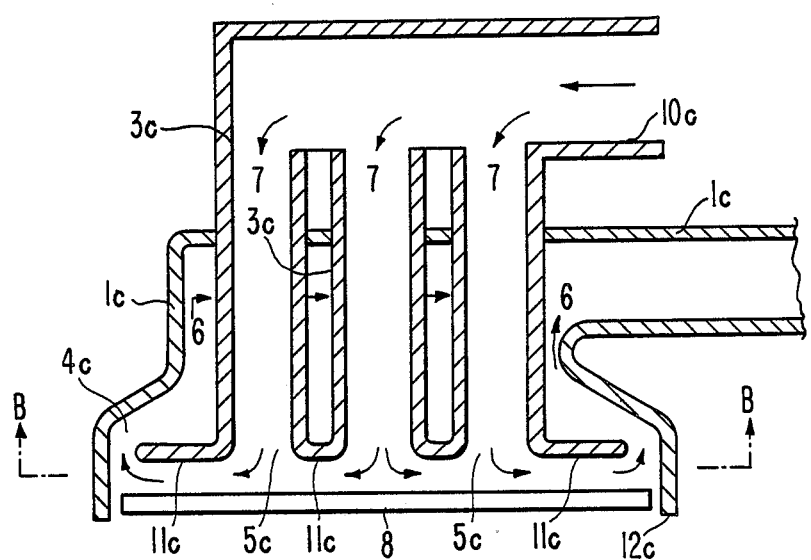
FIG. 6 is a vertical sectional view of the essential features of a modification of the FIG. 5 embodiment of the present invention.
Figure 7:
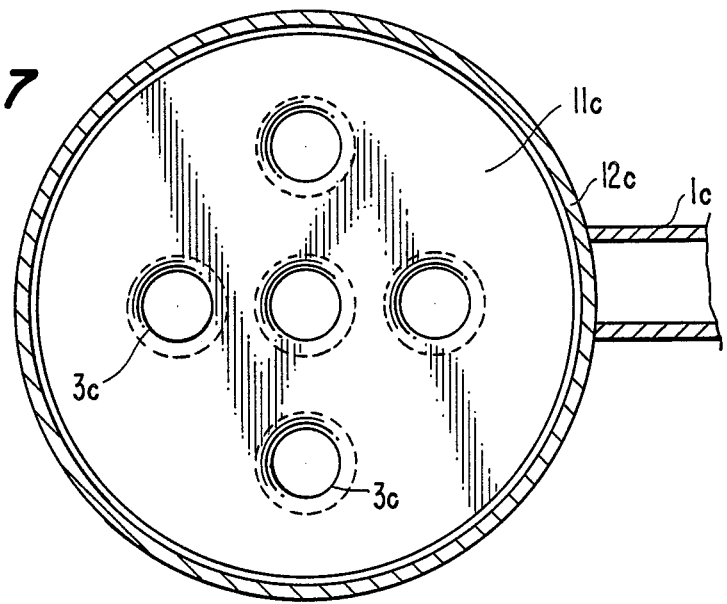
FIG. 7 is a sectional view taken upon the line B—B of FIG. 6.

As shown in FIGS. 6 and 7, several vertical delivery pipes 3c are combined together and connected to a duct 10c. Openings 5c of the delivery pipes 3c are connected by a large round plate, which forms a flat surface 11c substantially perpendicular to the direction of flow of air 7 in the delivery pipes 3c. A torus suction pipe 1c is provided around the delivery pipes 3c while the lower periphery of the outer wall of the torus suction pipe 1c is extended several mm to 20 mm lower than the flat surface 11c, to form a stopper 12c. The duct 10c is connected to a delivery opening (not shown) of a fan, and the suction pipe 1 is connected to a suction opening (not shown) of a fan.

Openings 4c and 5c are near a plate 8. Air 7 is delivered from delivery pipes 3c. Air 6 of not less volume than of the air 7 is inhaled in suction pipe 1c. The plate 8 floats in the air without contacting the openings 4c, 5c and the flat surface 11c, and also can be conveyed with the entire apparatus by moving same.

Example 3

Figure 8:
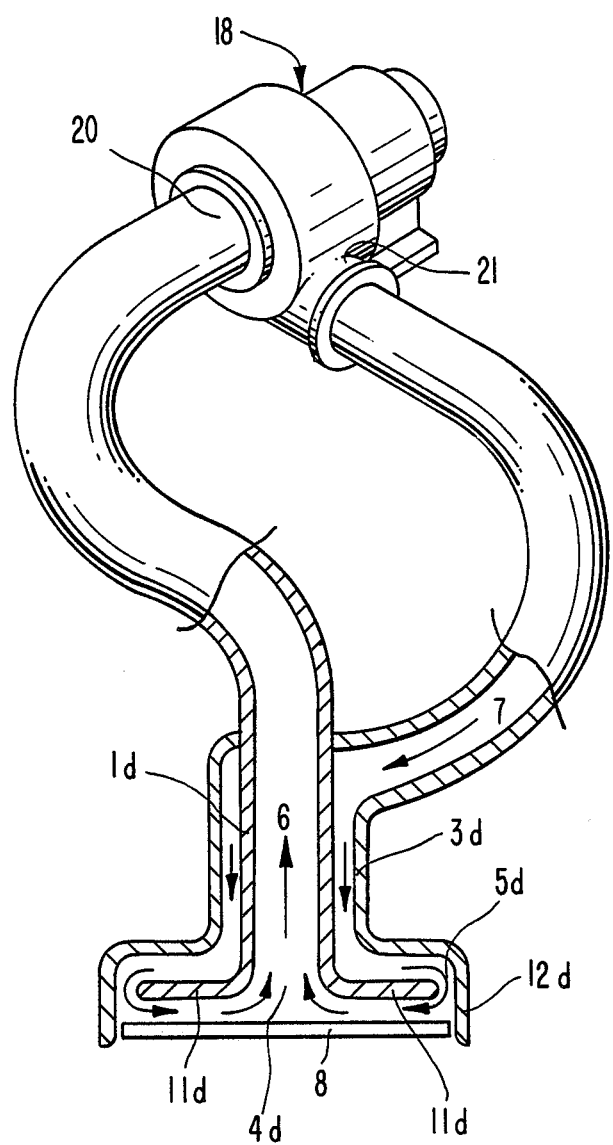
FIG. 8 is a vertical sectional view of the essential features of another modification of the FIG. 5 embodiment of the present invention.

As shown in FIG. 8, opening 4d of a vertical suction pipe 1d, which is round in cross-section, is extended to form a flat surface 11d substantially perpendicular to the direction of flow of fluid 6 in the suction pipe 1d. A torus delivery pipe 3d is provided around the lower part of the suction pipe 1d. The lower periphery of the outer wall of the torus delivery pipe 3d is extended several mm to 20 mm lower than the flat surface 11d to form a stopper 12d. The delivery pipe 3d is connected to a delivery opening 21 of a fan 18, and the suction pipe 1d is connected to a suction opening 20 of the fan 18.

The flat surface 11d is near a plate 8, and air 7 is delivered from delivery pipe 3d and air 6 of the same volume as of the air 7 is inhaled in suction pipe 1d. The plate 8 floats in the air without contacting the flat surface 11d, and also can be conveyed with the entire apparatus by moving same.

Example 4

Figure 9:
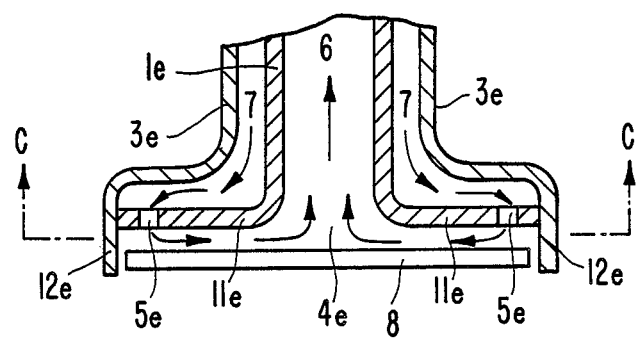
FIG. 9 is a vertical sectional view of the essential features of another modification of the FIG. 5 embodiment of the present invention.
Figure 10:
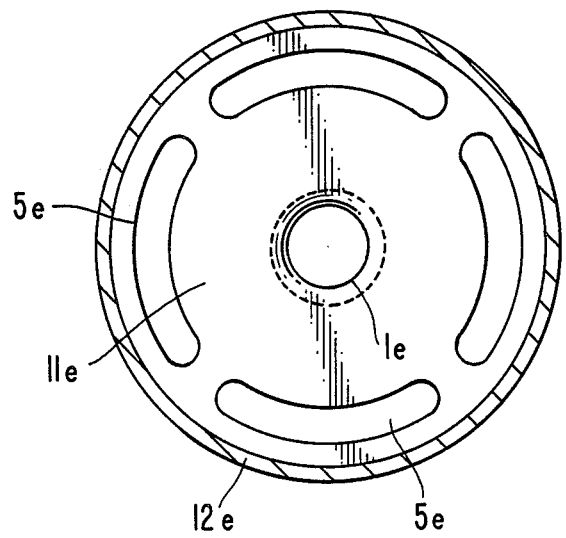
FIG. 10 is a sectional view taken upon the line C—C of FIG. 9.

As shown in FIGS. 9 and 10, opening 4e of a vertical suction pipe 1e, which is round in cross-section, is extended to form a flat surface 11e substantially perpendicular to the direction of flow of fluid 6 in the suction pipe 1e. A suitable number of delivery openings 5e are provided near the periphery of the flat surface 11e. A wall is provided outside of the suction pipe 1e and upon the flat surface 11e to form a torus delivery pipe 3e. The lower periphery of the wall of the delivery pipe 3e is extended several mm to 20 mm lower than the flat surface 11e to form a stopper 12e. The delivery pipe 3e is connected to a delivery opening (not shown) of a fan, and the suction pipe 1e is connected to a suction opening (not shown) of a fan.

The flat surface 11e is near a plate 8, and air 7 is delivered from delivery pipe 3e and the delivered air is inhaled in suction pipe 1e (air 6). The plate 8 floats in the air without contacting the opening 4e and the flat surface 11e, and also can be conveyed with the entire apparatus by moving the entire apparatus.

Even when the two faces of the plate 8 are prohibited from physical contact, the edge of the plate is allowed to contact other solids in many cases. In this event, the plate 8 supported below the flat surface is supported at its edge by the stopper 12e, and the plate 8 can be revolved with the rotation of the entire apparatus, to be supported vertically, and also can be revolved further to be supported horizontally upon the flat surface 11e without physical contact.

The flow directions of air 7 and 6 can be reversed, as shown in FIGS. 5 and 8.

In the above Examples 1 to 4, during the supporting and conveying of the plate 8 under the flat surfaces 11, 11c, 11d, 11e without physical contact and at a constant distance from the flat surfaces 11, 11c-e, and during revolving the plate with the apparatus to a vertical position and further to the upperside of the flat surface, the supporting of the plate 8 may become unstable, namely, the plate 8 vibrates up and down by a little fluctuation of the fluid's flow or of conveying speed. Then, the distance h of the flat surface 11 and the plate 8 fluctuates, and fluid 7 can not flow in the gap between the flat surfaces 11, 11c-e and the plate 8, to fluctuate the static pressure in the gap and to contact the plate 8 and the flat surfaces 11, 11c-e.

The object of the following Examples 5 and 6 is to eliminate the above disadvantage, to prevent the unstable vibration of the plate 8 in the supporting and conveying process, and to support or convey the plate 8 and further to revolve the plate 8, to the vertical position and to the horizontal position, upon the flat surface without physical contact. This object is achieved by cutting channels radially on the flat surface, according to the following Examples 5 and 6. Example 5 is closely related to Example 1, therefore, like elements in FIGS. 11 and 12 are numbered the same as in FIG. 5.

Example 5

Figure 11:
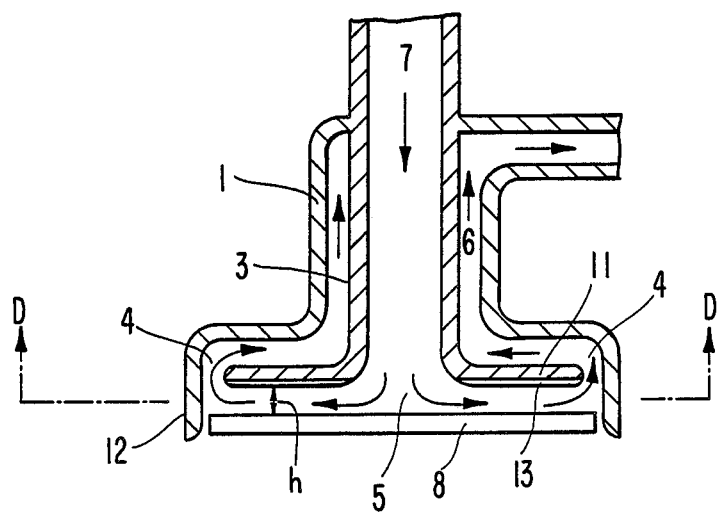
FIG. 11 is a vertical sectional view of the essential features of another embodiment of the present invention.
Figure 12:
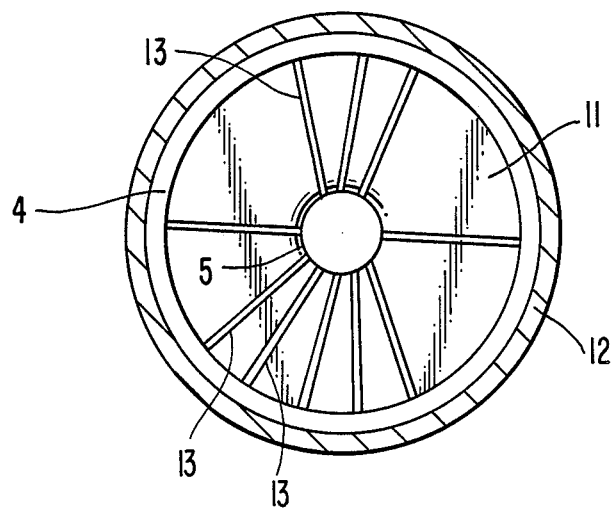
FIG. 12 is a sectional view taken upon the line D—D of FIG. 11.

As shown in FIGS. 11 and 12, opening 5 of vertical delivery pipe 3, which is round in cross-section, is extended in a substantially perpendicular direction to form a flat surface 11. The flat surface 11 is provided with many channels 13, 13, 13 from the opening 5 to the outer periphery. A torus suction pipe 1 is provided around the delivery pipe 3, the end of which has an opening 4 around the flat surface 11. The lower periphery of the outer wall of the torus suction pipe 1 is extended several mm to 20 mm lower than the flat surface 11 to form a stopper 12. The delivery pipe 3 is connected to a delivery opening (not shown) of a fan, and the suction pipe 1 is connected to a suction opening (not shown) of a fan.

When the flat surface 11 is moved near a plate 8, and air 7 is delivered from delivery pipe 3 and air 6 is inhaled in suction pipe 1, the air radially flowing in the gap of the flat surface 11 and the plate 8 is rendered uniform and stable by the channels 13, 13, 13, and the air flow is prevented from becoming unstable or from forming air eddys in the case of decelerated flow. And the plate 8 floats stably in the air without vibrating up and down and without contacting opening 5 and the flat surface 11. The plate maintains a constant distance from the opening 5 and the flat surface 11, and further can be conveyed with the entire apparatus by moving the apparatus; or by supporting the edge of the plate 8 by the stopper 12, the plate 8 can be revolved with the rotation of the entire apparatus, to be supported vertically, and also can be revolved further to be supported horizontally upon the flat surface 11 without physical contact. The flow direction of air 7 can be the reverse of the arrow in FIG. 11.

Example 6

Figure 13:
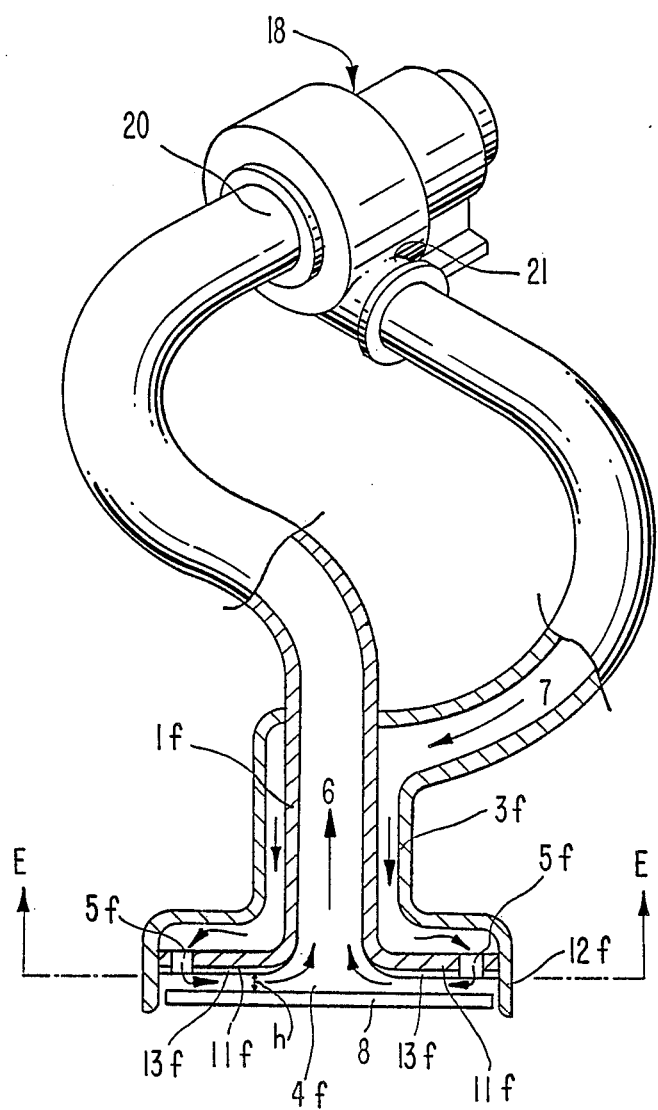
FIG. 13 is a vertical sectional view of the essential features of a modification of the FIG. 11 embodiment of the present invention.
Figure 14:
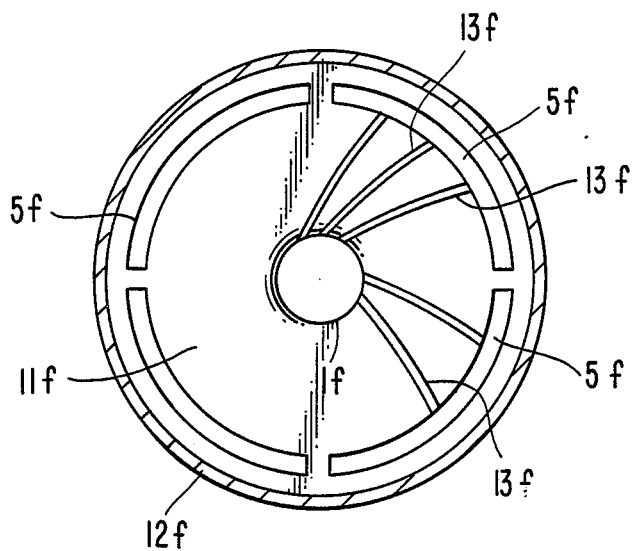
FIG. 14 is a sectional view taken upon the line E—E of FIG. 13.

As shown in FIGS. 13 and 14, opening 4f of a vertical suction pipe 1f is extended to form a flat surface 11f substantially perpendicular to the direction of flow of fluid 6 in the suction pipe, and a suitable number of delivery openings 5f, 5f are provided near the periphery of the flat surface 11f. The flat surface 11f is provided with many channels 13f, 13f, 13f, preferably from the opening 5 to the inner periphery, the channels being curved and/or inclined from the radial direction. A pipe wall is provided outside of the suction pipe 1f and upon the flat surface 11f to form a torus delivery pipe 3f. The lower periphery of the outer wall of the delivery pipe 3f is extended several mm to 20 mm lower than the flat surface 11f to form a stopper 12f. The delivery pipe 3f is connected to a delivery opening 21 of a fan 18, and the suction pipe 1f is connected to a suction opening 20 of the fan 18.

The flat surface 11f is moved near a plate 8, and air 7 is delivered from delivery pipe 3f and the delivered air is inhaled in suction pipe 1f (shown as air 6). The plate 8 floats in the air without contacting the flat surface 11f, without vibrating up and down as it rotates by the air flow along the curved and/or inclined channels 13f, holding its relative position to the flat surface 11f. The plate 8 can also be conveyed with the entire apparatus by moving the entire apparatus. The flow direction of airs 7 and 6 can be reversed as shown in FIG. 13.

In Examples 5 and 6 the shapes of the sections of delivery pipes 3, 3f of suction pipes 1, 1f of flat surfaces 11, 11f; and and of stoppers 12, 12f are round, but may be elliptic, polygonal, etc.

The above examples relate to supporting and/or conveying a plate without a hole, and a plate with a hole, such as a hard disc with a hole, can not be supported, as in FIG. 5, for example. That is, when the plate 8 has a hole below the opening 5, fluid 7 cannot flow into the gap between the flat surface 11 and the plate 8, and negative pressure does not result in the gap h. Thus, the plate can not be supported or floated in the atmosphere without physical contact.

Examples 7 and 8 have as their object deleting the above disadvantage, so as to permit the support and/or conveyance of a plate with a hole, such as hard disc with a hole, without physical contact, as well as revolving from its horizontal state to vertical state and further to reversed horizontal state. This object is achieved by providing a ring-shaped flat surface between a ring-shaped opening of the delivery pipe and a ring-shaped opening of the suction pipe (these two openings being concentric).

Example 7

Figure 15:
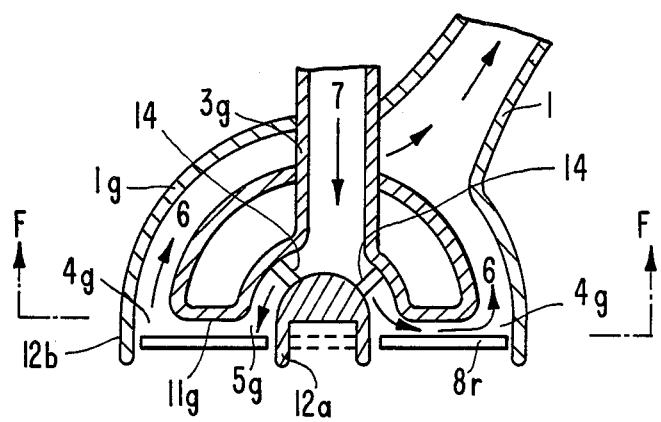
FIG. 15 is a vertical sectional view of the essential features of another embodiment of the present invention.
Figure 16:
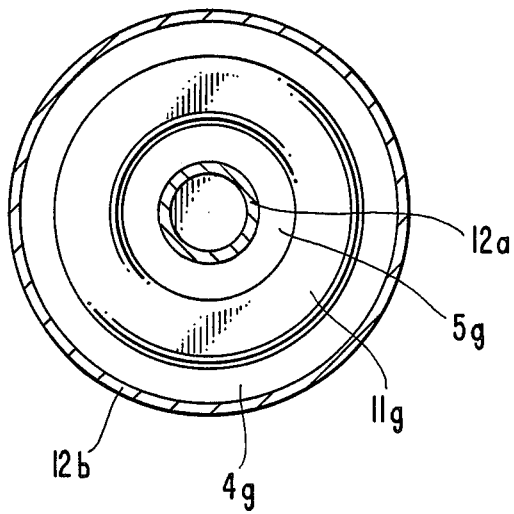
FIG. 16 is a sectional view taken upon the line F—F of FIG. 15.

As shown in FIGS. 15 and 16, the ring-shaped opening 5g of the delivery pipe 3g is extended in a perpendicular direction to form a ring-shaped flat surface 11g. A torus suction pipe 1g is provided, the end of which is provided with a ring-shaped opening 4g around the flat surface 11g. The inner periphery of the ring-shaped opening 5g and the outer periphery of the ring-shaped opening 4g are extended several mm to 20 mm lower than the flat surface 11g to form stoppers 12a, 12b. The delivery pipe 3g is connected to a delivery opening (not shown) of a fan, and the suction pipe 1g is connected to a suction opening (not shown) of a fan. The inner face of the divergent part of the delivery pipe 3g is supported by connecting with suitable points of the inner face of the outer wall by connecting rods 14, 14.

Openings 4g and 5g are near a round plate 8r with a round hole, as shown in FIG. 15. The inner periphery 12a of the opening 5g and the hole of plate 8r are arranged such that air 7 is delivered from the delivery pipe 3g and the delivered air 7 is inhaled in suction pipe 1g as shown by the arrow 6. The plate 8r floats in the air without contacting the openings 4g, 5g and the flat surface 11g, and also can be conveyed with the entire apparatus by moving the entire apparatus.

Example 8

Figure 17:
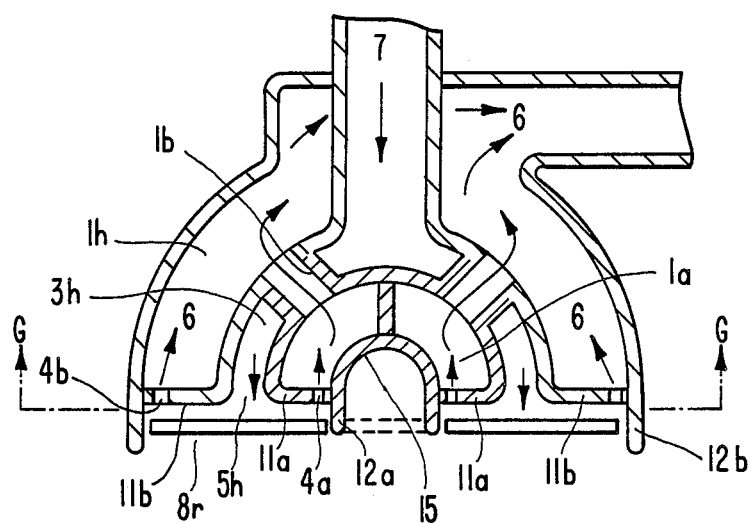
FIG. 17 is a vertical sectional view of the essential features of a modification of the FIG. 15 embodiment of the present invention.
Figure 18:
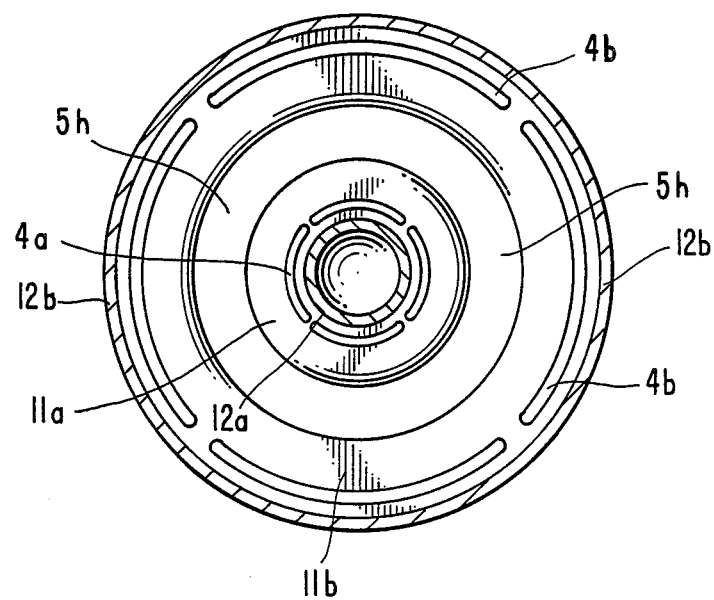
FIG. 18 is a sectional view taken upon the line G—G of FIG. 17.

As shown in FIGS. 17 and 18, a ring-shaped opening 5h of a delivery pipe 3h is extended to both inner and outer sides substantially perpendicular to the flowing direction of fluid 7 in the delivery pipe 3h to form ring-shaped flat surfaces 11a, 11b. A suitable number of suction openings 4a, 4a are provided near the inner periphery of the inner flat surface 11a, and a suitable number of suction openings 4b, 4b are provided near the outer periphery of the outer flat surface 11b. A pipe wall 15 is provided inside of the delivery pipe 3h to form a cavity 1a. The suction openings 4a, 4b connect with cavity 1a and suction pipe 1h, respectively. Suction pipe 1h and cavity 1a are connected with a suitable number of connecting pipes 1b. The inner periphery of flat surface 11a and the outer periphery of flat surface 11b are extended downwardly several mm to 20 mm lower than the flat surfaces 11a, 11b to form stoppers 12a, 12b. The delivery pipe 3h is connected with a delivery opening (not shown) of a fan, and the suction pipe 1h is connected with a suction opening (not shown) of a fan.

Opening 5h is near a round plate 8r with a round hole as shown in FIGS. 19 and 20. The positions of the inner periphery 12a of the cavity 1a and the hole of plate 8r are arranged such that air 7 is delivered from the delivery pipe 3h and air 6 of same volume as of air 7 is inhaled in suction pipe 1h as shown by the arrows 6. The plate 8 floats in the air without contacting openings 4a, 4b, 5h and flat surfaces 11a, 11b, maintaining a constant distance from them, and also can be conveyed with the entire apparatus by moving the entire apparatus. The flow directions of air 7 and 6 can be reversed in Examples 7, 8.

In the above Examples 7 and 8, the plate 8 is described as being round with a round hole; however, plates of different shape such as a rectangular plate with a rectangular hole, as shown in FIGS. 21–23, or a triangular plate with a round hole as shown in FIG. 24, can be supported and/or conveyed in the same way by fitting the shape of the flat surface to the shape of the plate.

Although the above-mentioned examples can be used as the essential parts of mechanical holding and conveying systems, the following Examples 9 and 10 relate to modifications to hold and convey a plate without physical contact by handwork.

Example 9

Figure 25:
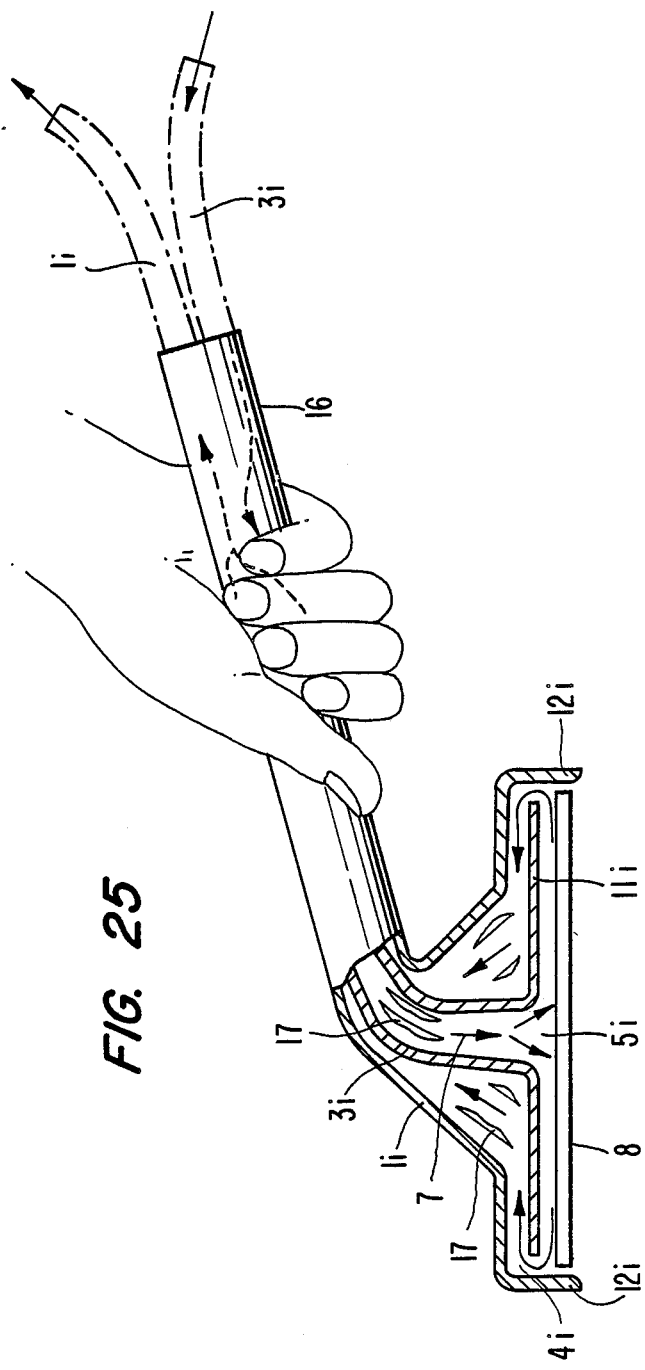
FIG. 25 is an elevational view of the essential features of another example of the present invention, a portion of the structure being broken away for the purpose of illustration.

As shown in FIG. 25, the opening 5i of a vertical delivery pipe 3i with a round section is extended in a substantially perpendicular direction to form a flat surface 11i. A torus suction pipe 1i is provided around the delivery pipe 3i. The end of the outer wall of the suction pipe 1i forms an opening 4i around the flat surface 11i. The lower periphery of the outer wall of the torus suction pipe 1i is extended several mm to 20 mm lower than the flat surface 11i to form a stopper 12i. The delivery pipe 3i is installed in the suction pipe 1i, and the suction pipe 1i is elongated to form a handle 16. The delivery pipe 3i and suction pipe 1i are separated at the end of the handle 16i. The delivery pipe 3i is connected with a delivery opening (not shown) of a fan, and the suction pipe 1i is connected with a suction opening (not shown) of a fan. The inner walls of the delivery pipe 3i and of the suction pipe 1i are preferably provided with flow-uniforming plates 17.

Handle 16 is held by hand. The flat surface 11i is moved near a plate 8, and air 7 is delivered from delivery pipe 3i and air 6 of the same volume as of the air 7 is inhaled in suction pipe 1i. The plate 8 floats in the air without contacting openings 4i, 5i and the flat surface 11i, and also can be conveyed with the entire apparatus by moving the entire apparatus, or by supporting the edge of the plate 8 by the stopper 12i, the plate 8 can be revolved with the rotation of the entire apparatus, to support the plate 8 vertically, and also can be revolved further to support the plate 8 horizontally upon the flat surface 11i without physical contact.

Example 10

Figure 26:
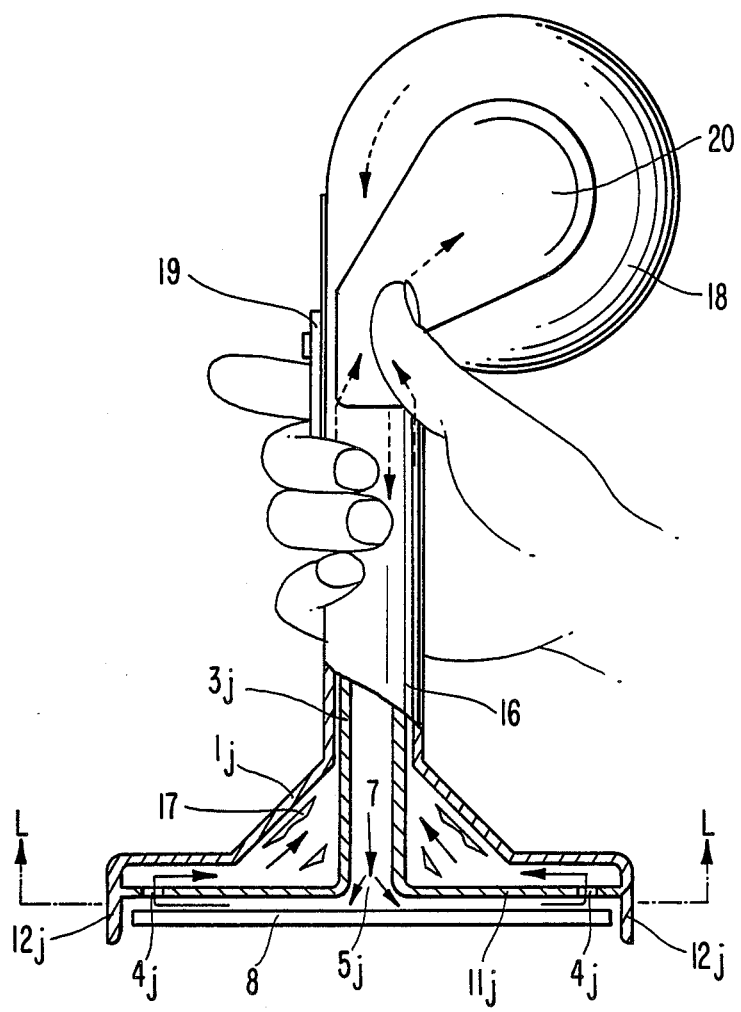
FIG. 26 is the elevational view of the essential features of another modification of the FIG. 25 embodiment of the present invention, a portion of the structure being broken away for the purpose of illustration.
Figure 27:
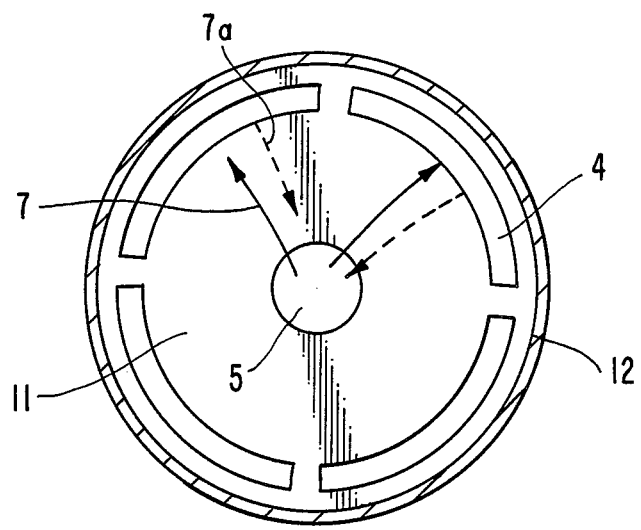
FIGS. 27 and 28 are sectional views taken on line L—L of FIG. 26.
Figure 28:
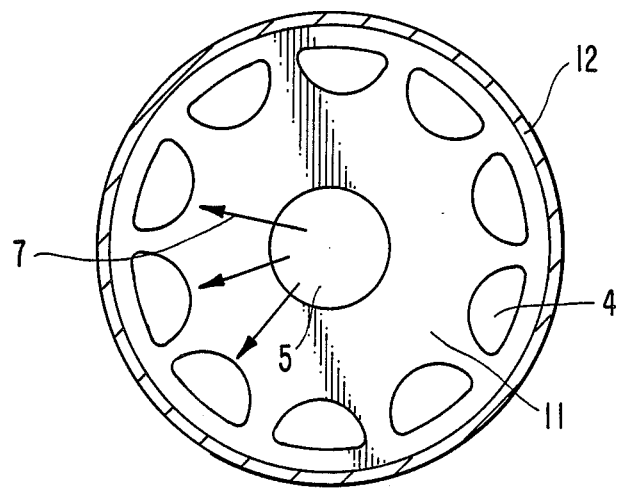

As shown in FIGS. 26 and 27, the opening 5j of the vertical delivery pipe 3j, which is round in cross-section, is extended to form a flat surface 11j perpendicular to the flowing direction of fluid 7 in the delivery pipe 3j. A suitable number of suction openings 4j are provided near the outer periphery of the flat surface 11j. A pipe wall is provided outside of the delivery pipe 3j and upon the flat surface 11j to form a torus suction pipe 1j. Suction pipe 1j is elongated to form a handle 16, and switch 19 of a fan 18 is provided at a suitable position on the handle 16. The delivery pipe 3j is connected with a delivery opening (not shown) of a fan 18. The suction pipe 1j is connected with a suction opening 20 of fan 18, the lower periphery of the outer wall of the suction pipe 1j being extended several mm to 20 mm lower than the flat surface 11j, to form a stopper 12j. The inner wall of the suction pipe 1j is preferably provided with flow-uniforming plate 17. The shape of suction openings 4j of flat surface 11j may be modified as shown in FIG. 28, for example. A plate 8 can be supported and/or conveyed without physical contact similarly as in Example 9.

The flow directions of airs 7 and 6 can be reversed in Examples 9 and 10.

OTHER EXAMPLES

In the above examples, the method of supporting and/or conveying a plate in the air uses air as fluids 6 and 7. However, a plate can be supported and/or conveyed using a gas other than air or water or any other liquid as fluids 6 and 7. Fluids 6 and 7 other than the fluids surrounding the plate 8 and the apparatus can also be used. For example, a plate 8 can be washed by using a liquid detergent as fluids 6 and 7 and, thereafter, dried by using air at room temperature or heated air as fluids 6 and 7.

In the apparatus shown in FIG. 5, when a plate 8 was supported in the air under the conditions of:

| W | weight of plate | 20 g |
| $P_j$ | jet pressure of delivered fluid | 10 g/cm$^2$ |
| $P_D$ | negative pressure between flat surface and plate | −40 mmAq |
| $A_D$ | area of cross section of opening 5 | 2.84 cm$^2$ |
| $A_P$ | area of flat surface 11 | 17.6 cm$^2$ | the plate 8 was supported with 0.5 mm of the distance h between the upper surface of the plate 8 and the flat surface 11.

Using the apparatus as shown in FIG. 29, the relation of the distance h and the suction force −F(g) or pressure force +F(g) and static pressure in the delivery pipe $P_2$ (mmAq) was measured.

Figure 30:
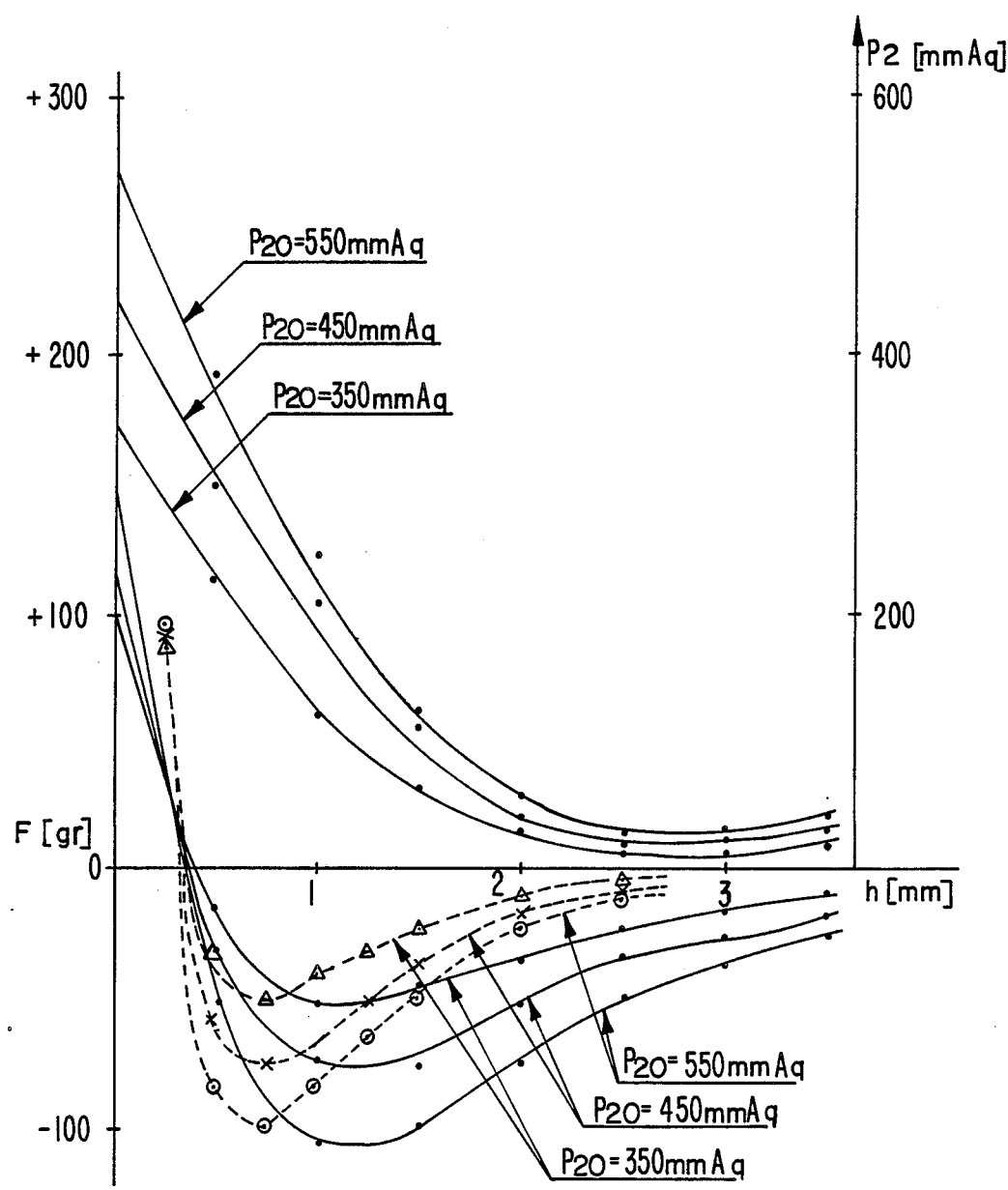
FIG. 30 is a graph showing the relationship of the distance h between the flat surface 11 and the plate 8 and force F on the plate 8 and static pressure $P_2$ in the delivery pipe.

The solid lines in FIG. 30 show the relations between h and F and $P_2$ at the conditions of:

| 2kR | inside diameter of delivery pipe 3 | 19 mm |
| 2R | outside diameter of flat surface 11 | 51 mm |
| Ds | diameter of round plate 8 | 56 mm |
| W | weight of round plate 8 | 20 g |
| $P_{20}$ | static pressure in the delivery pipe 3 when air 7 was introduced in the delivery pipe 3 and opening 5 was closed | 350 mmAq, 450 mmAq, 550 mmAq. |

The graph shows that
(1) the flat surface 11 and the plate 8 can not contact, as the plate 8 receives a pressure at the point of h=0, i.e., when the plate 8 will contact with the flat surface 11,
(2) when the distance h between both surfaces becomes about 0.3 mm, the pressure in the gap between both surfaces becomes negative, and this negative pressure increases as the gap h becomes large,
(3) when the distance h becomes larger than about 4.3 mm, the pressure in the gap becomes plus, i.e. larger than the atmospheric pressure. Thus, the plate can be supported without physical contact in the range of negative pressure in the graph.

Symbols of some factors in FIG. 5 are designated as shown in FIG. 29, i.e., as follows:

|  | in pipe | at opening | at any point | at exit of flat surface |
|---|---|---|---|---|
| radius | kR | kR | rR | R |
| pressure | $P_2$ | $P_1$ | P | $P_o$ |
| speed | $v_2$ | $v_1$ | v | $v_o$ |
| gap |  | h | h | h |

Using the equation of continuity, $$2\pi R h v_o = 2\pi(rR)hv = 2\pi(kR)hv_1 = \pi(KR)^2 v_2 \quad (1)$$

$$\therefore v = \frac{1}{\gamma} v_0, \quad v_1 = \frac{1}{k} v_0, \quad v_2 = \frac{2h}{k^2 R} v_0 \quad (2)$$

Designating the density of fluid as $\rho$ (1.3 kg/m$^3$ in the case of air) and the loss coefficient of contraction as $e_\nu$ (about 0.3 in the case of air), applying Bernoulli's theorem at the entry of the flat surface, $$\frac{1}{2}(v_1^2 - v_2^2) + \frac{1}{\rho}(P_1 - P_2) + \frac{1}{2} v_1^2 e_\nu = 0 \quad (3)$$

Substituting equation (2) to equation (3)

$$\frac{1}{2}\left(\frac{1}{k^2} - \frac{4h^2}{k^4 R^2}\right)v_0^2 + \frac{1}{\rho}(P_1 - P_2) + \frac{1}{2}\frac{1}{k^2} v_0^2 e_\nu = 0 \quad (4)$$

$$\therefore P_2 - P_1 = \frac{1}{2} \frac{\rho v_0^2}{k^2}\left(1 + e_\nu - \frac{4h^2}{k^2 R^2}\right) \quad (5)$$

Applying Bernoulli's theorem at a differential part of the flat surface $$d\left(\frac{1}{2}v^2\right) + \frac{1}{\rho}dP + \frac{1}{2}v^2 f \frac{2}{h} d(rR) = 0 \quad (6)$$

wherein f designates a coefficient of friction, and f is 16/Re in the case of laminar flow.

Equivalent diameter (hydraulic diameter) between flat surfaces is $$d_e = 4 \times \frac{\text{area of cross section}}{\text{wetted perimeter}} = 4 \times \frac{h \times 1}{2 \times 1} = 2h \quad (7)$$

$$\therefore f = \frac{16}{Re} = \frac{8\mu}{h\rho v} = \frac{8\mu\gamma}{h\rho v_0} \quad (8)$$

Substituting equation (8) to equation (6)

$$d\left(\frac{1}{2}v^2\right) + \frac{1}{\rho}dP + \frac{8\mu v_o}{\rho h^2} \frac{d(\gamma R)}{\gamma} = 0 \quad (9)$$

Integrating this equation $$\frac{1}{2}(v_o^2 - v^2) + \frac{1}{\rho}(P_o - P) - \frac{8\mu v_o}{\rho h^2} R \ln r = 0 \quad (10)$$

$$(P_o - P) = \frac{1}{2}\rho v_o^2\left(\frac{1}{\gamma^2} - 1\right) + \frac{8\mu v_o}{h^2} R \ln r \quad (11)$$

At the entry of the flat surface, equation (11) is $$P_0 - P_1 = \frac{1}{2}\frac{\rho v_0^2}{k^2}(1 - k^2) + \frac{8\mu v_0}{h^2} R \ln k \quad (12)$$

Eliminating $P_1$ from equations (12) and (5)

$$P_2 - P_o = \frac{1}{2}\frac{\rho v_o^2}{k^2}\left(e_\nu - \frac{4h^2}{k^2 R^2} + k^2\right) - \frac{8\mu v_o^2}{h^2} R \ln k \quad (13)$$

The value of $v_o$ can be obtained by knowing $P_2 - P_o$ from this equation (13). Force acting on pipe part upwardly is $$F_1 = \pi(kR)^2(P_o - P_2) \tag{14}$$

As the atmospheric pressure acting on the under surface of plate is equal to $P_o$, force acting on the flat surface part upwardly is $$F_2 = \int_{kR}^{R} (P_o - P)2\pi(rR)d(rR) \tag{15}$$

$$= \pi R^2 \int_{k}^{1} (P_o - P)d(r^2)$$

Substituting equation (11) to equation (15) and integrating $$F_2 = \tag{16}$$

$$-\pi R^2 \left[ \frac{1}{2} \rho v_o (\ln k^2 + 1 - k^2) + \frac{4\mu v_o^2}{h^2} (k^2 \ln k^2 - k^2 + 1) \right]$$

Force acting all parts is $$F = F_1 + F_2 \tag{17}$$

$$= -\pi R^2 [k^2(P_2 - P_0) + \frac{1}{2} \rho v_o^2 (\ln k^2 + 1 - k^2) +$$

$$\frac{4 \mu v_0^2}{h^2} (k^2 \ln k^2 - k^2 + 1)]$$

Substituting $v_o$ found from equation (13) to equation (17), F can be found.

FIG. 30 shows measured values and values calculated by equation (17) of F (intersecting the axis of abscissas) and measured values of $P_2$ (not intersecting the axis of abscissas) in the conditions of

| Fluids 6, 7 | air |
|---|---|
| Static pressure $P_{20}$ | 350 mmAq, |
| at opening 5 when the | 450 mmAq, |
| opening 5 is closed | 550 mmAq |
| Inner diameter (2kR) | 19 mm. |
| of delivery pipe 3 | |

In the drawing, solid lines of F show measured values, and broken lines show the calculated values of F assuming $e_v$ as 0.3. The drawing shows that there are some differences between measured values and calculated values, but these two groups of curves have the same tendency.

Figure 1:
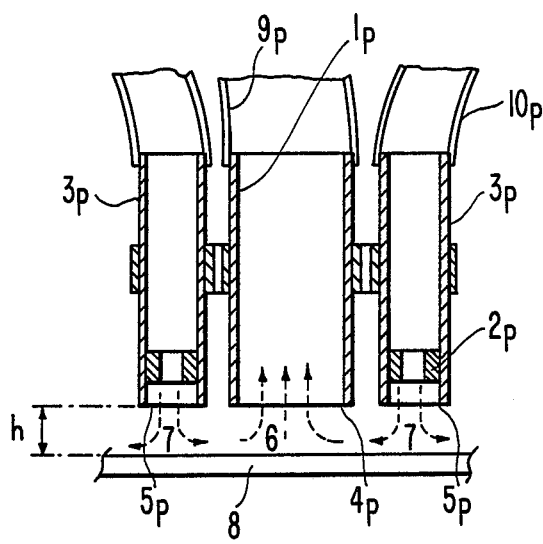
FIG. 1 is a vertical sectional view of the essential parts of a prior art device for supporting and floating a plate with fluid without physical contact.
Figure 2:
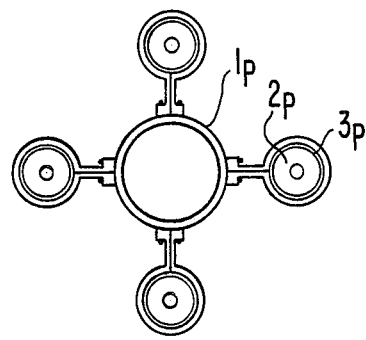
FIG. 2 is the bottom view of FIG. 1.
Figure 3:
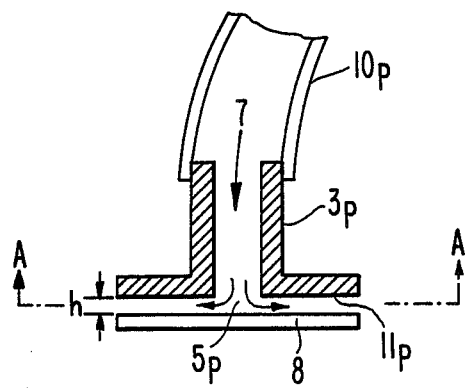
FIG. 3 is a vertical sectional view of the essential features of a prior patent application.
Figure 4:
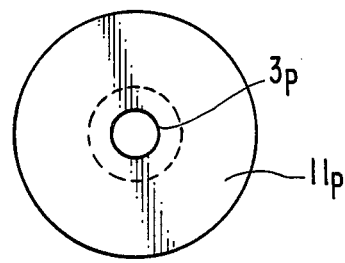
FIG. 4 is the sectional view taken upon the line A—A of FIG. 3.

In the method disclosed in Japanese Pat. No. 40343/1976, as shown in FIGS. 1 and 2, the combination of a suction pipe and a delivery pipe was essential to support a plate without physical contact.

In the method disclosed in prior Japanese Patent Application No. 71950/1985 and in the present invention, a plate with a flat upper surface can be supported near and under the opening of the delivery pipe by providing a flat surface extending from the opening of the delivery pipe, and the plate can be conveyed with the apparatus when some stoppers are provided extending below the periphery of the flat surface. In these methods the plate having a flat upper surface can be conveyed in the horizontal direction with the apparatus by moving the apparatus.

In the aforesaid prior application, delivered air 7 is delivered from the gap between the flat surface 11 and the plate 8. The air 7 disturbs the atmosphere and the plate 8 is in danger of being stained with minute particles of dust. In the present invention, the delivered air 7 from the gap between the flat surface 11 and the plate 8 is immediately inhaled into the suction pipe 1 and does not spread into the atmosphere. Dust in the room cannot be blown up and attach on the plate.

Two fans may be used, one for delivering the air 7 in the delivery pipe 3 and another for inhaling the air 6 into the suction pipe. Or, only one fan may be used for both delivering and inhaling. If only one fan is used, the flow of air forms a closed circuit, i.e., delivery pipe 3 to suction pipe 1 to the fan to delivery pipe 3 (but a little atmospheric air can enter the circuit from the gap between the stopper 12 and the plate 8), and little dust can enter into the circulating air from atmosphere.

When starting the operation of supporting a plate, it is not preferable to move the opening 5 of the delivery pipe 3 near the plate 8 after starting the fan, as the delivered air disturbs the surrounding atmosphere, but it is preferable to start the fan after the opening 5 has been near the plate 8.

In the Examples 5 and 6, as the flat surface 11 is provided with channels 13, the flow of the fluid in the gap between the flat surface and the plate is rendered more uniform, and cannot arouse air eddys. The static pressure of air in the gap between the flat surface and the plate cannot change. U-and-down vibration of the plate is completely prevented. When the flat surface 11 is provided with channels 13 curved and/or inclined from the radial direction, the plate can be supported and/or conveyed further stably by gyroscopic effect, as the floating plate rotates by the circling flow of fluid in the gap between the flat surface and the plate.

The present invention is extremely effective for conveying and/or handling of plates, such as semiconductor wafers, magnetic discs, mirrors, which should not be marred or stained and which can not be touched with hand or by a gripper, in the producing or packing process.

What is claimed is:

1. A method of supporting and/or conveying a plate with fluid without physical contact, comprising the steps of:
    providing a flat surface extending at a delivery opening of a delivery pipe in a substantially perpendicular direction to the flow of fluid in said delivery pipe;
    providing a torus inhaling opening of a suction pipe around said flat surface;
    providing a first extended wall from an outer edge of said suction pipe, such that said extended wall extends beyond said flat surface to form a stopper;
    moving the openings near the plate;
    delivering said fluid from said delivery pipe;
    inhaling said fluid in said suction pipe, to support the plate near and at a constant distance from said flat surface without physical contact; and
    recirculating said fluid from said suction pipe for reuse in said delivery pipe.

2. A method of supporting and/or conveying a plate with fluid without physical contact according to claim 1, further comprising the step of:
    providing radial channels on said flat surface.

3. A method of supporting and/or conveying a plate with fluid without physical contact according to claim 1, further comprising the step of:
providing curved radial channels on said flat surface.

4. A method of supporting and/or conveying a plate with fluid without physical contact according to claim 1, wherein both said inhaling opening of said suction pipe and said delivery opening of said delivery pipe are of torus shape, further comprising the step of:
providing a second extended wall from an inner edge of said delivery pipe, such that said first and second extended walls extend beyond the flat surface to form stoppers.

5. A method of supporting and/or conveying a plate with fluid without physical contact, comprising the steps of:
providing a flat surface extending at an inhaling opening of a suction pipe in a substantially perpendicular direction to the flow direction of said fluid in said suction pipe;
providing a torus delivery opening of a delivery pipe around said flat surface;
providing a first extended outer wall from an outer edge of said delivery pipe, such that said extended wall extends beyond said flat surface to form a stopper;
moving the openings near the plate;
delivering said fluid from said delivery opening;
inhaling said fluid through said inhaling opening to said suction pipe, to support the plate near and at a constant distance to said flat surface without physical contact; and
recirculating said fluid to said delivery pipe from said suction pipe.

6. A method of supporting and/or conveying a plate with fluid without physical contact according to claim 5, further comprising the step of:
providing radial channels on said flat surface.

7. A method of supporting and/or conveying a plate with fluid without physical contact according to claim 5, further comprising the step of:
providing curved radial channels on said flat surface.

8. A method of supporting and/or conveying a plate with fluid without physical contact according to claim 5, wherein both said inhaling opening of said suction pipe and said delivery opening of said delivery pipe are of torus shape, further comprising the step of:
providing a second extended wall from an inner edge of said suction pipe such that said first and second extended walls extend beyond the flat surface to form stoppers.

9. An apparatus for supporting and conveying a ring-shaped disc without physical contact, comprising:

a delivery pipe having a ring-shaped delivery opening for delivering fluid, said delivery pipe having an interior edge extending farther than an outer edge of said delivery pipe to form an interior stopper;
a ring-shaped flat surface attached to the outer edge of said delivery pipe extending perpendicularly to flow of the fluid in said delivery pipe;
a suction pipe with a ring-shaped suction opening for withdrawing the fluid, said suction pipe having an inner edge attached to said flat surface surrounding the outer edge of said delivery pipe and an outer edge extending farther than the inner edge of said suction pipe to form an outer stopper; and
recirculating means for recirculating the fluid, having a recirculating delivery opening connected to a receiving end of said delivery pipe, and a recirculating suction opening connected to a delivery end of said suction pipe.

10. An apparatus for supporting and conveying a ring-shaped disc without physical contact according to claim 9, wherein said ring-shaped disc is a hard disc and a diameter of said interior stopper is slightly less than a diameter of an inner opening of the hard disc, and diameter of said outer stopper is slightly greater than an overall diameter of the hard disc.

11. An apparatus for supporting and conveying a plate without physical contact, which comprises:
a flat surface having a centrally located opening and a plurality of openings near its outer periphery;
a delivery pipe connected to said centrally located opening for delivery of fluid to said centrally located opening;
a suction pipe for withdrawing the fluid connected to said plurality of openings near the outer periphery of said flat surface from a same side of said flat surface as said delivery pipe;
stopper means running along the outer periphery of said flat surface and extending perpendicularly from said flat surface on an opposite side of said flat surface from said delivery pipes and said suction pipe; and
recirculating means for recirculating the fluid having a recirculating delivery opening connected to a receiving end of said delivery pipe and having a recirculating suction opening connected to a delivery end of said suction pipe.

12. An apparatus for supporting and conveying a plate according to claim 11, wherein the plate is circular, and said flat surface is circular having a diameter slightly larger than the diameter of the plate.

13. An apparatus for supporting and conveying a plate according to claim 12, further comprising radial channels on said flat surface for directing the flow of said fluid.

* * * * *

UNITED STATES PATENT AND TRADEMARK OFFICE
CERTIFICATE OF CORRECTION

PATENT NO. : 4,735,449
DATED : April 5, 1988
INVENTOR(S) : Tosimi Kuma

It is certified that error appears in the above-identified patent and that said Letters Patent is hereby corrected as shown below:

Title page, item [73] should read:

-- Kabushiki Kaisha Seibu Giken, Sasaguri, Japan part interest. --

Col. 4
Line 20, delete "5cof" and insert --5c of--.

Col. 6
Line 24, delete "5" and insert --5f--;
Line 47, delete "11f'; and" and insert --11f--.

Col. 8
Line 42, delete "3f" and insert --3j--.

Col. 9
Line 67, delete "KR" and insert --kR--.

Signed and Sealed this

Fifteenth Day of November, 1988

Attest:

DONALD J. QUIGG

Attesting Officer

Commissioner of Patents and Trademarks